United States Patent [19]
Horiba

[11] Patent Number: 5,744,866
[45] Date of Patent: Apr. 28, 1998

[54] LOW RESISTANCE GROUND WIRING IN A SEMICONDUCTOR DEVICE

[75] Inventor: Shinichi Horiba, Tokyo, Japan

[73] Assignee: NEC Corporation, Tokyo, Japan

[21] Appl. No.: 816,040

[22] Filed: Mar. 11, 1997

[51] Int. Cl.$^6$ ........................................... H01L 23/48
[52] U.S. Cl. ..................... 257/752; 257/755; 257/758; 257/770
[58] Field of Search ........................... 257/752, 754, 257/755, 758, 770, 903

[56] References Cited

U.S. PATENT DOCUMENTS 5,414,302  5/1995  Shin et al. ............................ 257/752

*Primary Examiner*—Minh-Loan Tran
*Attorney, Agent, or Firm*—Young & Thompson

[57] ABSTRACT

There is provided a method of fabricating a semiconductor device, including the steps of (a) forming a first insulating film on a semiconductor substrate, (b) forming gate electrodes on the first insulating film, the gate electrodes having a two-layered structure including a first conductive film and a second insulating film lying over the first conductive film, (c) forming a diffusion layer around the gate electrodes, (d) forming an insulating sidewall film around a sidewall of the gate electrodes, (e) covering a resultant with a third insulating film, (f) forming a contact hole between the gate electrodes in self-aligning fashion, (g) covering a resultant with a second conductive film, (h) covering a resultant with a fourth insulating film, (i) planarizing the fourth insulating film, (j) isotropically etching the planarized fourth insulating film to make a part of the second conductive film to appear, (k) covering a resultant with a third conductive film, and (l) etching the third conductive film, the fourth insulating film and the second conductive film in a selective area to form a ground wiring layer. The above mentioned method makes it possible to form a contact hole in self-aligning fashion and further to form a low resistance ground wiring.

12 Claims, 7 Drawing Sheets

LOW RESISTANCE GROUND WIRING IN A SEMICONDUCTOR DEVICE

BACKGROUND OF THE INVENTION

1. FIELD OF THE INVENTION

The invention relates to a semiconductor device and a method of fabricating the same, and more particularly to a static random access memory (hereinafter, referred to simply as "SRAM") and a method of fabricating the same.

2. DESCRIPTION OF THE RELATED ART

Higher integration in a semiconductor device these days has made a device become smaller and smaller in size, and it has become quite difficult to have a sufficient margin for align a contact hole with a mask used for wiring arrangement. As a solution to this problem, there has been widely used the technique to form a contact hole in self-aligning fashion. Hereinbelow will be explained a conventional SRAM having a ground contact hole formed in self-aligning fashion.

FIG. 1 illustrates a SRAM cell having ground wiring arrangement. Gate electrodes 220 are formed on a field oxide film 202 and diffusion layers 206. A ground wiring 230 is formed above contact holes 210, and is connected to the diffusion layers 206 through the contact holes 210.

FIGS. 2A, 3A, 4A and 5A are cross-sectional views taken along the line A—A in FIG. 1, and FIGS. 2B, 3B, 4B and 5B are cross-sectional views taken along the line B—B in FIG. 1. FIGS. 2A to 5B illustrate respective steps of a method of fabricating the SRAM cell illustrated in FIG. 1. Hereinbelow is explained the method with reference to those drawings.

First, as illustrated in FIGS. 2A and 2B, a field oxide film 202 and a gate oxide film 203 are formed on a silicon substrate 201. Then, gate electrodes are formed on the silicon substrate 201 through the oxide films 202 and 203. Each of the gate electrodes has a two-layered structure including a polysilicon film 204 and an oxide film 205 lying on the polysilicon film 204.

Then, as illustrated in FIG. 3B, ion-implantation is carried out with the gate electrodes acting as a mask to thereby form n-type diffusion layers 206. Then, a resultant is entirely covered with an oxide film followed by anisotropic etching to thereby form insulating sidewall films 207 around sidewalls of the gate electrodes. Then, a resultant is entirely covered with an interlayer insulating film or an oxide film 208, as illustrated in FIGS. 3A and 3B.

Then, as illustrated in FIGS. 4A and 4B, a photoresist pattern is formed over a resultant, followed by anisotropic etching with the photoresist pattern acting as a mask to thereby form a contact hole 210 in self-aligning fashion about the polysilicon film 204.

Then, after the photoresist pattern 209 has been removed, a resultant is entirely covered with a tungsten silicide film 211 which will work as a ground wiring.

In the above mentioned conventional method of fabricating a semiconductor device, as indicated with an arrow C in FIG. 5A, the tungsten silicide film 211 cannot avoid to have poor coverage in an area where a spacing between the adjacent gate electrodes is quite small. As a result, the tungsten silicide film 211 has just a small thickness in such an area, and hence has a wiring resistance three to four times greater than that of an area having sufficient coverage, that is, a planarized area. This is accompanied with a problem that ON-state current of a driver transistor in SRAM is deteriorated to thereby cause an effective ratio to reduce with the result of deterioration in SRAM performance.

Even if the tungsten silicide film 211 is formed thicker, a thickness of the tungsten silicide film 211 is not increased so much in an area indicated with an arrow C where a spacing between the gate electrodes is quite small. Thus, the formation of the tungsten silicide film 211 thicker does not solve the above mentioned problem. In addition, the formation of the tungsten silicide film 211 thicker increases fabrication time. From this standpoint, the formation of the tungsten silicide film 211 thicker is not allowed to adopt.

As illustrated in FIGS. 2B, 3B, 4B and 5B each showing a cross-section taken along the line B—B in FIG. 1, sufficient coverage is provided for an area where the oxide film 208 is formed over the gate electrodes and the contact hole 210 is formed in self-aligning fashion by making use of a step formed at the oxide film 205. On the other hand, the above mentioned problem of the poor coverage arises in such an area as illustrated in FIG. 5A where a contact hole is not formed. This problem is inherent to a highly integrated semiconductor device which forms a contact hole in self-aligning fashion.

To solve the above mentioned problem, it is considered that a ground wiring is made of material having superior coverage, such as polysilicon. However, composing a ground wiring of polysilicon brings a new problem that polysilicon would generate higher contact resistance and wiring resistance than those of tungsten silicide.

SUMMARY OF THE INVENTION

In view of the foregoing problem of a prior method of fabricating a semiconductor device, it is an object of the present invention to provide a semiconductor device and a method of fabricating the same which are capable of forming a contact hole in self-aligning fashion and forming a low-resistive ground wiring.

In one aspect, there is provided a method of fabricating a semiconductor device, including the steps of (a) forming a first insulating film on a semiconductor substrate, (b) forming gate electrodes on the first insulating film, the gate electrodes having a two-layered structure including a first conductive film and a second insulating film lying over the first conductive film, (c) forming a diffusion layer around the gate electrodes, (d) forming an insulating sidewall film around a sidewall of the gate electrodes, (e) covering a resultant with a third insulating film, (f) forming a contact hole between the gate electrodes in self-aligning fashion, (g) covering a resultant with a second conductive film, (h) covering a resultant with a fourth insulating film, (i) planarizing the fourth insulating film, (j) isotropically etching the planarized fourth insulating film to make a part of the second conductive film to appear, (k) covering a resultant with a third conductive film, and (l) etching the third conductive film, the fourth insulating film and the second conductive film in a selective area to form a ground wiring layer.

In a semiconductor device made in accordance with the above mentioned method, a ground wiring layer is comprised of the second conductive film a part of which is made exposed in the step (j), and the third conductive film formed on the second conductive film. Since the third conductive film is formed on the planarized fourth insulating film, the third conductive film can have a lower layer resistance which in turn enables the ground wiring layer to have a lower layer resistance.

In addition, the second conductive film which partially constitutes a ground wiring layer is formed along a contact hole in self-aligning fashion, it is also possible to form a contact hole in self-aligning fashion as well as reduce a resistance of the ground wiring layer.

For instance, the second conductive film may be composed of refractory metal or refractory metal silicide, and the second and third conductive films may be made of common conductive material such as refractory metal and refractory metal silicide.

There is further provided a method of fabricating a semiconductor device, including the steps of (a) forming a first insulating film on a semiconductor substrate, (b) forming gate electrodes on the first insulating film, the gate electrodes having a two-layered structure including a first conductive film and a second insulating film lying over the first conductive film, (c) forming a diffusion layer around the gate electrodes, (d) forming an insulating sidewall film around a sidewall of the gate electrodes, (e) covering a resultant with a third insulating film, (f) forming a contact hole between the gate electrodes in self-aligning fashion, (g) covering a resultant with a second conductive film, (h) covering a resultant with a third conductive film, (i) covering a resultant with a fourth insulating film, (j) planarizing the fourth insulating film, (k) isotropically etching the planarized fourth insulating film to make a part of the third conductive film to appear, (l) covering a resultant with a fourth conductive film, and (m) etching the fourth conductive film, the fourth insulating film, the third conductive film and the second conductive film in a selective area to form a ground wiring layer.

For instance, the second conductive film may be composed of refractory metal or refractory metal silicide, and the third conductive film may be composed of polysilicon. The second and fourth conductive films may be made of common conductive material.

The contact between the second and fourth conductive films are made by a simple step, that is, a step of etching the fourth insulating film until a top surface of the third conductive film appears and then forming the fourth conductive film on the appearing third conductive film to thereby electrically contact the second conductive film to the fourth conductive film through the third conductive film. By forming the second conductive film of refractory metal or refractory metal silicide and forming the third conductive film of polysilicon, it is possible to have sufficient contact between the second and fourth conductive films, even if the fourth insulating film is overetched, because the third conductive film made of polysilicon has superior coverage and ensures electrical contact between the second and fourth conductive films. Namely, sufficient contact is ensured between the two films constituting the ground wiring layer.

In another aspect, there is provided a semiconductor device including (a) a semiconductor substrate, (b) a first insulating film formed partially on the semiconductor substrate, (c) gate electrodes formed on the first insulating film, the gate electrodes having a two-layered structure including a first conductive film and a second insulating film lying over the first conductive film, (d) a diffusion layer formed at a surface of the semiconductor substrate around the gate electrodes, (e) an insulating sidewall film formed around a sidewall of the gate electrodes, (f) a third insulating film partially covering the semiconductor substrate, the insulating sidewall film and the gate electrodes so that the diffusion layer, a part of the gate electrodes and a top edge of the insulating sidewall film are in exposure, (g) a second conductive film covering the third insulating film, exposed part of the gate electrodes, exposed top edge of the insulating sidewall film and the semiconductor substrate, (h) a fourth insulating film having a planarized top surface at such a level that a top surface of the second conductive film is in exposure, and (i) a third conductive film bridging over the top surface of the second conductive film. The third conductive film, the fourth insulating film and the second conductive film cooperate with one another to form a ground wiring layer.

The second conductive film may be composed of refractory metal or refractory metal silicide. The second and third conductive films may be made of common conductive material such as refractory metal and refractory metal silicide. The second insulating film and the insulating sidewall film may be made of nitride.

There is further provided a semiconductor device including (a) a semiconductor substrate, (b) a first insulating film formed partially on the semiconductor substrate, (c) gate electrodes formed on the first insulating film, the gate electrodes having a two-layered structure including a first conductive film and a second insulating film lying over the first conductive film, (d) a diffusion layer formed at a surface of the semiconductor substrate around the gate electrodes, (e) an insulating sidewall film formed around a sidewall of the gate electrodes, (f) a third insulating film partially covering the semiconductor substrate, the insulating sidewall film and the gate electrodes so that the diffusion layer, a part of the gate electrodes and a top edge of the insulating sidewall film are in exposure, (g) a second conductive film covering the third insulating film, exposed part of the gate electrodes, exposed top edge of the insulating sidewall film and the semiconductor substrate, (h) a third conductive film covering the second conductive film, (i) a fourth insulating film having a planarized top surface at such a level that a top surface of the third conductive film is in exposure, and (j) a fourth conductive film bridging over the top surface of the third conductive film. The fourth conductive film, the fourth insulating film, the third conductive film and the second conductive film cooperate with one another to form a ground wiring layer.

The second conductive film may be composed of refractory metal or refractory metal silicide, and the third conductive film may be composed of polysilicon. The second and fourth conductive films may be made of common conductive material such as refractory metal or refractory metal silicide, in which case the third conductive film may be composed of polysilicon.

BRIEF DESCRIPTION OF THE DRAWINGS

The above and other objects and advantageous features of the present invention will be made apparent from the following description made with reference to the accompanying drawings, in which like reference characters designate the same or similar parts throughout the drawings in which.

DESCRIPTION OF THE PREFERRED EMBODIMENTS

Figure 1:
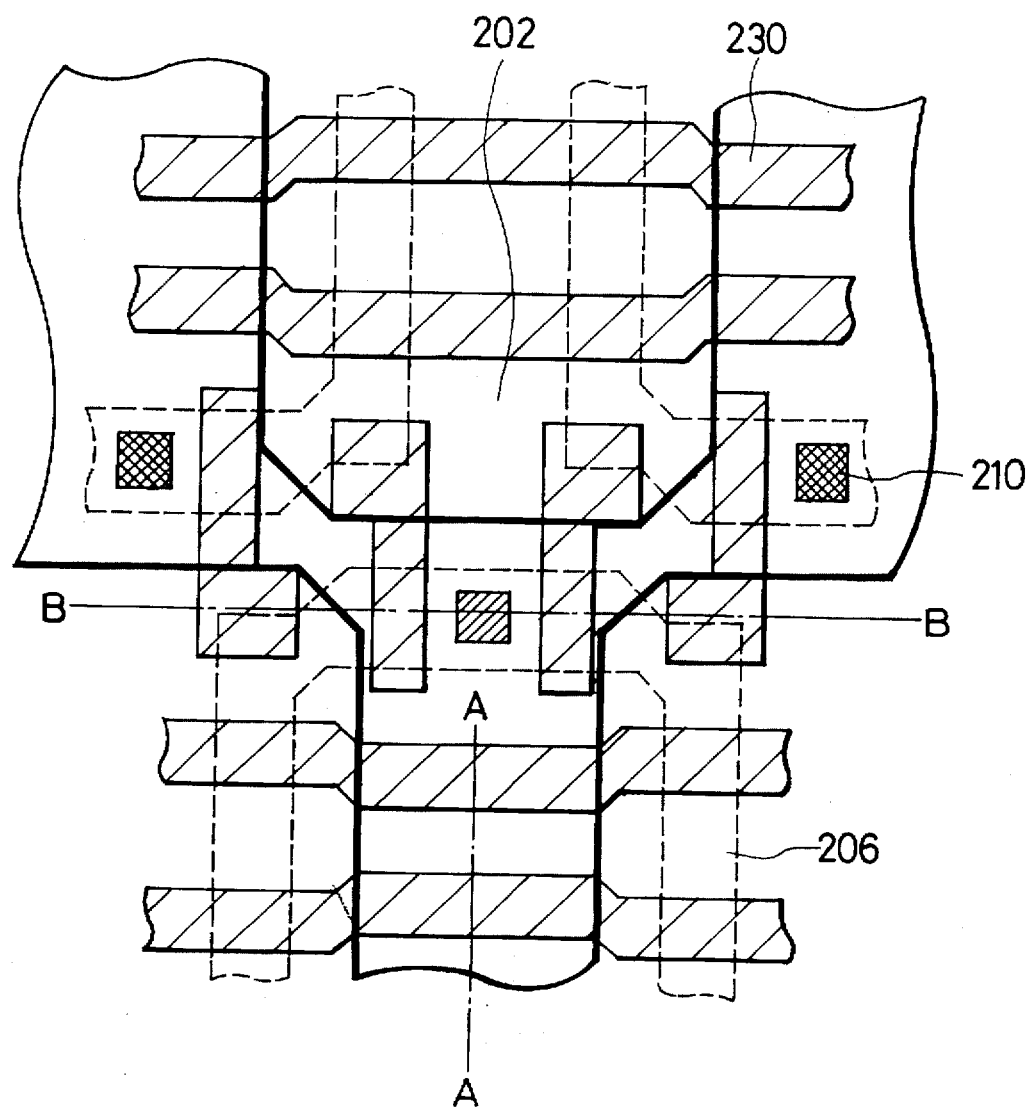
FIG. 1 is a plan view of a semiconductor device made in accordance with a conventional method.
Figure 2A:
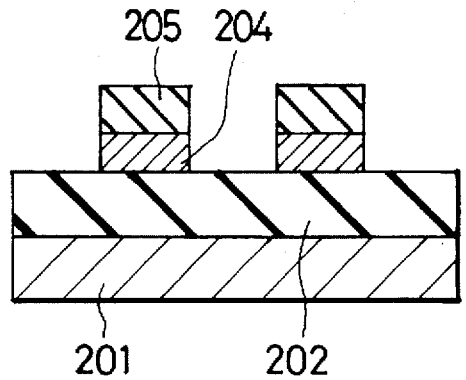
FIGS. 2A, 3A, 4A, 5A and 2B, 3B, 4B, 5B are cross-sectional views of a semiconductor device, illustrating respective steps of a conventional method.
Figure 2B:
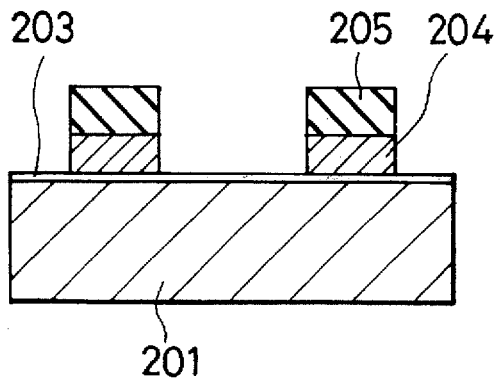
Figure 3A:
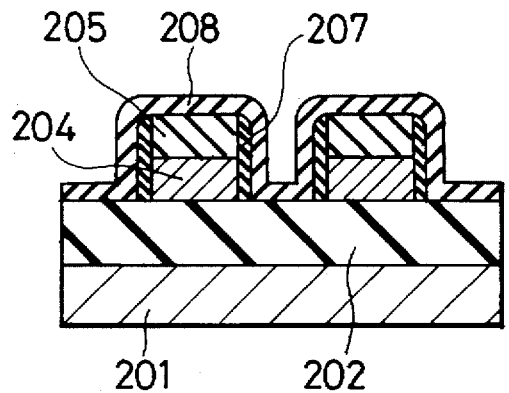
Figure 3B:
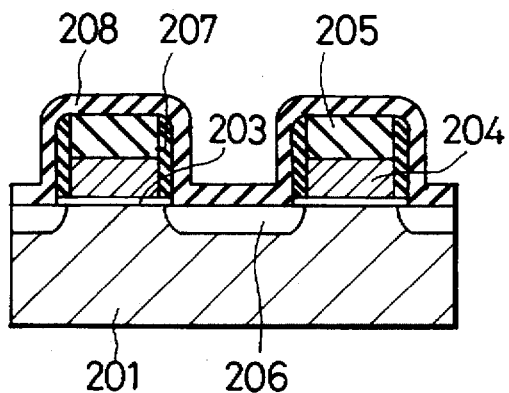
Figure 4A:
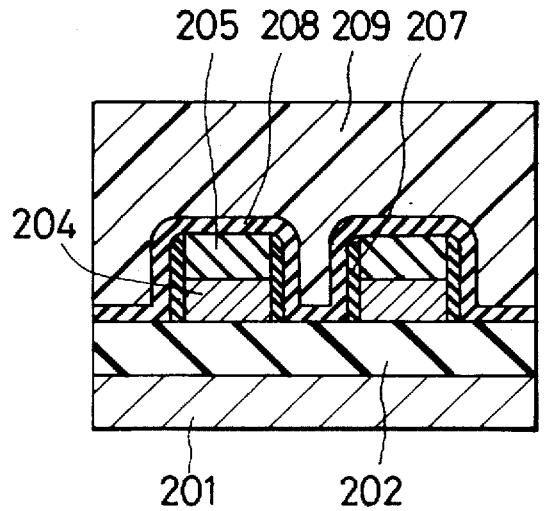
Figure 4B:
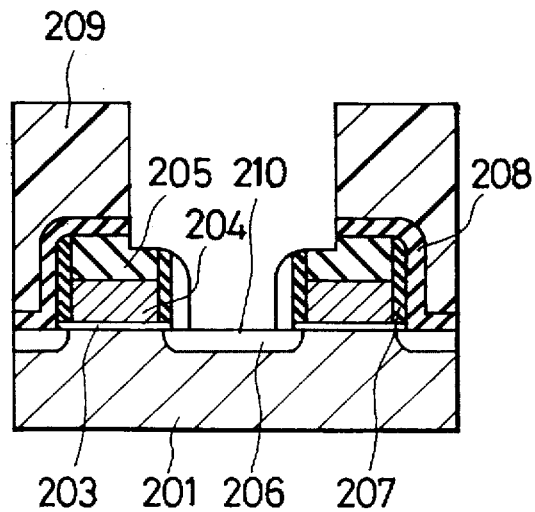
Figure 5A:
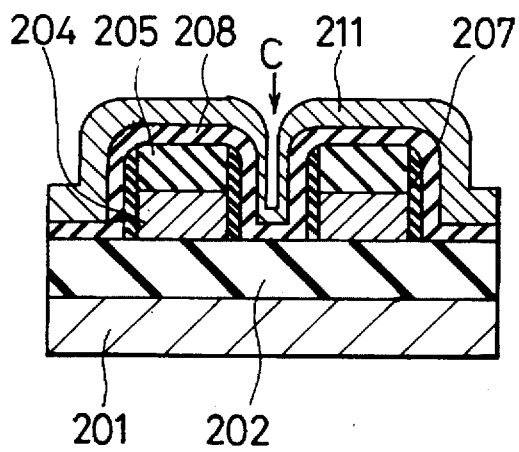
Figure 5B:
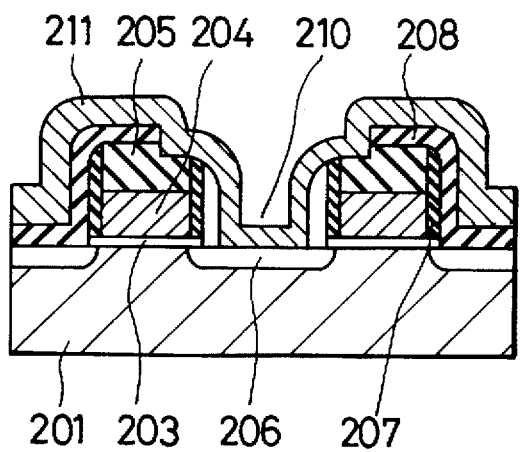
Figure 6:
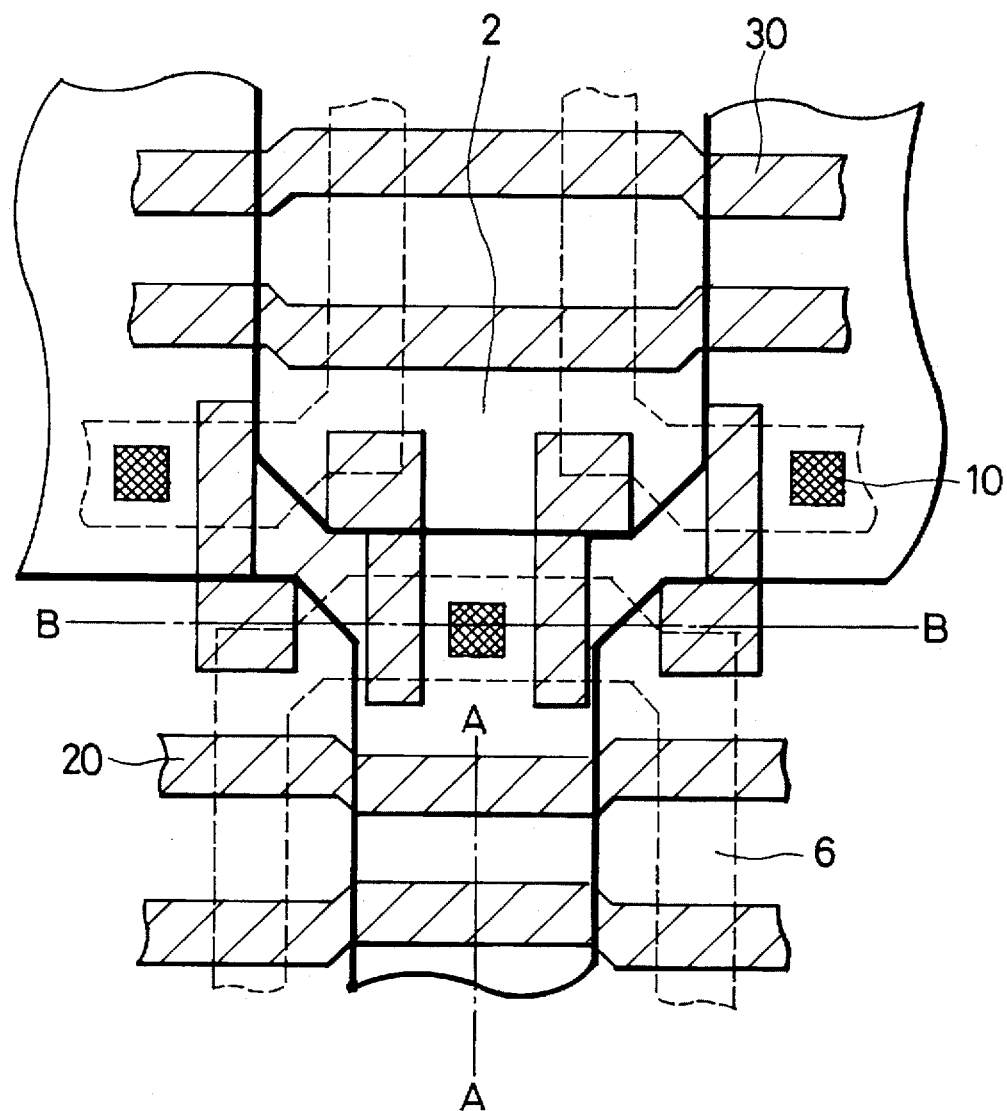
FIG. 6 is a plan view of a semiconductor device made in accordance with the present invention.

With reference to FIG. 6, a SRAM cell in accordance with the first embodiment of the present invention includes gate electrodes 20 formed on a field oxide film 2 and diffusion layers 6, and a ground wiring 30 formed above contact holes 10 through which the ground wiring 30 is connected to the diffusion layers 6.

Figure 11A:
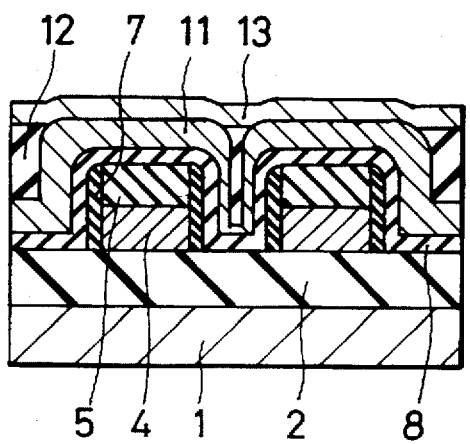
Figure 11B:
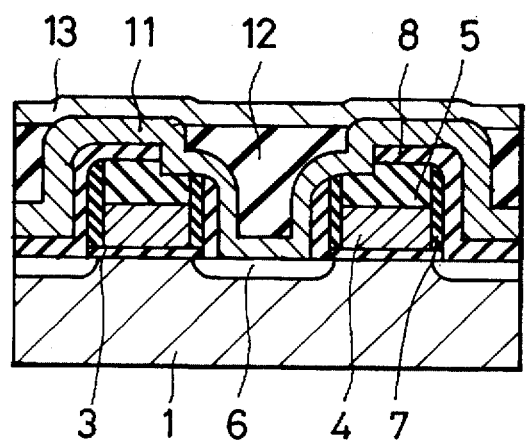

As illustrated in FIGS. 11A and 11B, the SRAM cell in accordance with the first embodiment includes a silicon substrate 1 on which field an oxide film 2 and gate oxide films 3 are partially formed both as a first insulating film. Gate electrodes (not referenced) are formed on the gate oxide films 3. Each of the gate electrodes has a two-layered structure including a polysilicon layer 4 as a underlying layer and as a first conductive film, and an oxide film 5 as a top layer and as a second insulating film.

The SRAM cell has n-type diffusion layers 6 at a surface of the silicon substrate 1 around the gate electrodes. The n-type diffusion layers 6 are formed, for instance, by arsenic ion-implantation by using the gate electrodes as a mask.

Each of the gate electrodes is covered at a sidewall thereof with insulating sidewall films 7.

As illustrated in FIG. 11B, there is formed a contact hole 10 between the gate electrodes, and thus a top edge portion of the gate electrodes is removed to thereby form a step-like portion. An oxide film 8 as a third insulating film covers the silicon substrate 1 except the step-like portions of the gate electrodes, top edges of the insulating sidewall films 7 and the n-type diffusion layer 6 formed between the gate electrodes.

As illustrated in FIGS. 11A and 11B, a tungsten silicide film 11 as a second conductive film covers the oxide film 8, the exposed step-like portions of the gate electrodes, the exposed top edges of the insulating sidewall films 7 and the exposed n-type diffusion layer 6. That is, the silicon substrate 1 is entirely covered with the tungsten silicide film 11.

Gaps formed between raised portions of the tungsten silicide film 11 are filled with BPSG film 12 as a fourth insulating film. As best illustrated in FIG. 11B, the BPSG film 12 is planarized at such a level that a top surface of the tungsten silicide film 11 is in exposure.

The exposed top surface of the tungsten silicide film 11 and the BPSG film 12 are covered with a tungsten silicide film 13 as a third conductive film. That is, the tungsten silicide film 13 bridges over the tungsten silicide film 11.

In the SRAM cell having the above mentioned structure, the tungsten silicide film 13, the BPSG film 12 and the tungsten silicide film 11 cooperate with one another to form a ground wiring layer.

In the above mentioned SRAM cell, the second and third conductive films 11 and 13 may be composed of refractory metal such as tungsten in place of refractory metal silicide such as tungsten silicide. In addition, though the second and third conductive films 11 and 13 are made of common conductive material, for instance, tungsten silicide in the first embodiment, it should be noted that the second and third conductive films 11 and 13 may be made of different conductive materials.

Furthermore, though the second insulating film 5 and the insulating sidewall film 7 are made of oxide in the first embodiment, they may be made of nitride instead of oxide.

Hereinbelow is explained a method of fabricating the above mentioned SRAM cell illustrated in FIG. 6, with reference to FIGS. 7A to 11A and 7B to 11B.

Figure 7A:
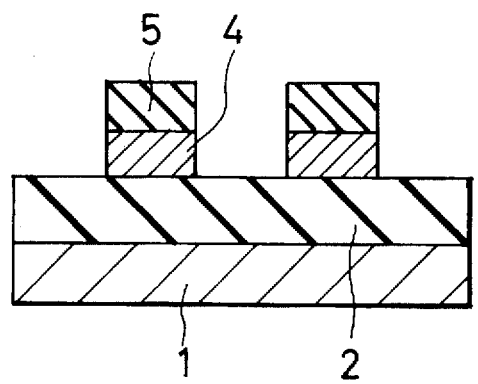
FIGS. 7A, 8A, 9A, 10A, 11A and 7B, 8B, 9B, 10B, 11B are cross-sectional views of a semiconductor device, illustrating respective steps of a method of fabricating a semiconductor device in accordance with the first embodiment of the present invention.
Figure 7B:
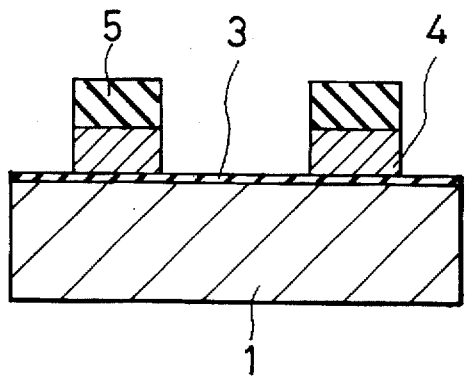

As illustrated in FIGS. 7A and 7B, there are formed, as a first insulating film, a field oxide film 2 having a thickness in the range of 2000 to 5000 angstroms and a gate oxide film having a thickness in the range of 100 to 300 angstroms on a silicon substrate 1. Then, gate electrodes (not referenced) are formed on the field oxide film 2 and gate oxide film 3 in a conventional way. In order to form a contact hole in self-aligning fashion in a later mentioned step, each of the gate electrodes is formed to have a two-layered structure including a polysilicon film 4, as a first conductive film, having a thickness in the range of 2000 to 4000 angstroms and an oxide film 5, as a second insulating, film having a thickness in the range of 2000 to 4000 angstroms.

Figure 8A:
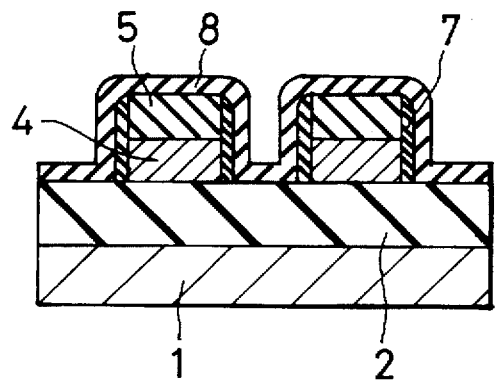
Figure 8B:
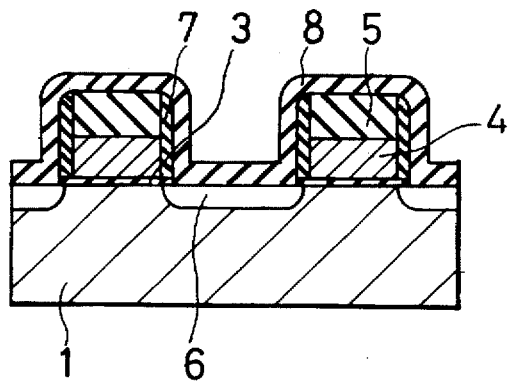

Then, as illustrated in FIGS. 8A and 8B, the silicon substrate 1 is ion-implanted at a dose of $1 \times 10^{15}$ cm$^{-2}$ arsenic (As) at 30 KeV with the gate electrodes acting as a mask to thereby form an n-type diffusion layer 6 around the gate electrodes.

Then, an oxide film (not illustrated) having a thickness in the range of 1000 to 2000 angstroms is formed entirely over a resultant, followed by anisotropic etching to thereby form insulating sidewall film 7 around a sidewall of the gate electrodes. Then, an oxide film 8 as a third insulating film is formed entirely covering a resultant. The oxide film 8 has a thickness in the range of 1000 to 2000 angstroms and acts as an interlayer insulating film.

Figure 9A:
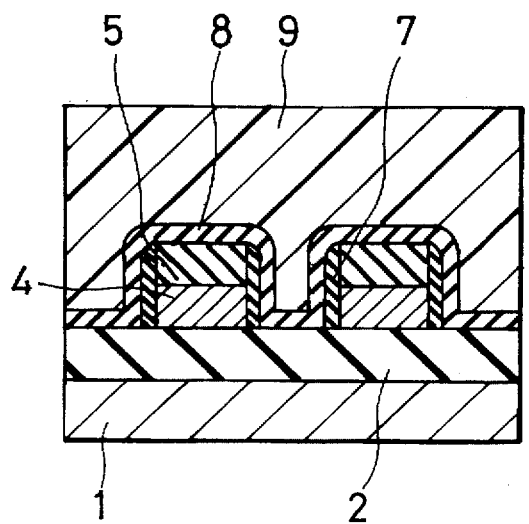
Figure 9B:
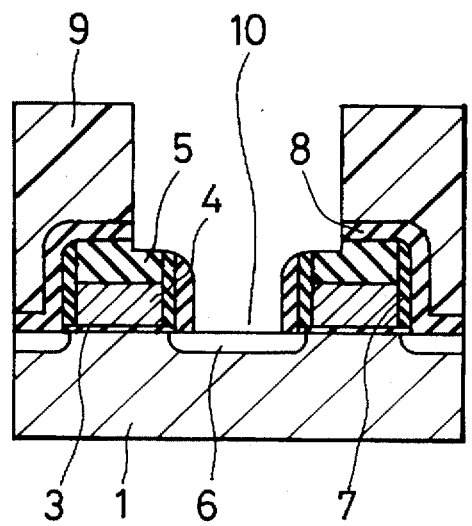

Then, a resultant is covered with photoresist, and the photoresist is patterned into a desired pattern in a conventional way. Then, as illustrated in FIGS. 9A and 9B, a resultant is anisotropically etched with the patterned photoresist 9 acting as a mask to thereby form a contact hole between the gate electrodes in self-aligning fashion relative to the polysilicon film 4.

Figure 10A:
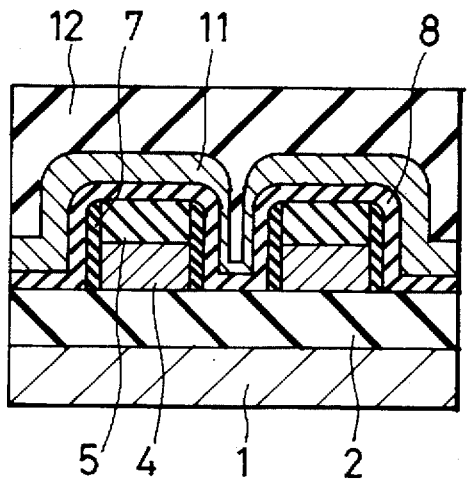
Figure 10B:
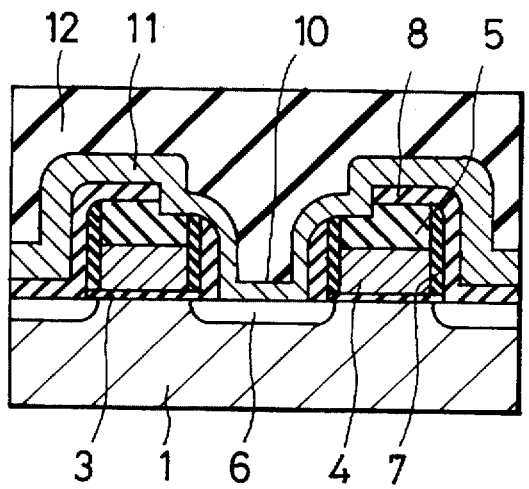

Then, as illustrated in FIGS. 10A and 10B, a resultant is covered with a tungsten silicide film 11, as a second conductive film, having a thickness in the range of 1000 to 2000 angstroms. The tungsten silicide film 11 works as a ground wiring. Then, on the tungsten silicide film 11 is formed BPSG film 12, as a fourth insulating film, having a thickness in the range of 5000 to 8000 angstroms. The BPSG film 12 is planarized or caused to have a flat top surface by high temperature reflow process.

Then, as illustrated in FIGS. 11A and 11B, the BPSG film 12 is wet- or dry-etched until a top surface of the tungsten silicide film 11 above the gate electrodes appears. Then, the exposed top surface of the tungsten silicide film 11 and the BPSG film 12 are covered with a tungsten silicide film 13, as a third conductive film, having a thickness in the range of 1000 to 2000 angstroms.

Then, a ground wiring layer constituted of the tungsten silicide films 11 and 13 is etched into a desired pattern by using photoresist as follows. First, the tungsten silicide film 13 is etched out by using SF$_6$, followed by the BPSG film 12 being etched by using CHF$_3$. Then, the tungsten silicide film 11 is etched by using SF$_6$.

In SRAM cell made in accordance with the above mentioned method, a ground wiring layer is comprised of the second conductive layer or tungsten silicide layer 11 formed covering the contact hole 10 in self-aligning fashion and the third conductive layer or tungsten silicide layer 13 formed on the planarized BPSG film 12 and having a low resistance, resulting in that the ground wiring layer as a whole has a low resistance.

In addition, sufficient contact between the tungsten silicide films 11 and 13 which cooperate with each other to form the ground wiring layer can be ensured, because the BPSG film 12 is etched until a top surface of the tungsten silicide film 11 appears and the tungsten silicide film 13 is formed on exposed surface of the tungsten silicide film 11. Since it is not necessary to carry out deposition of photoresist when the tungsten silicide film 11 is etched, the number of steps of the method is not increased.

Furthermore, the above mentioned embodiment makes it possible to form the contact hole 10 in self-aligning fashion similarly to a conventional method. The inventor conducted an experiment as to how much a total resistance including a contact resistance and a wiring resistance could be decreased. The result was that the total resistance of 800 ohms could be reduced down to 200 ohms for a 0.4 μm-contact with the number of fabrication steps not being increased.

FIGS. 12A, 12B, 13A and 13B are cross-sectional views of SRAM cell made in accordance with the second embodiment of the present invention. A plan view of the second embodiment is the same as the plan view of the first embodiment, that is, FIG. 6.

Similarly to the first embodiment, the SRAM cell in accordance with the first embodiment includes a silicon substrate 101 on which field an oxide film 102 and gate oxide films 103 are partially formed both as a first insulating film. Gate electrodes (not referenced) are formed on the gate oxide films 103. Each of the gate electrodes has a two-layered structure including a polysilicon layer 104 as a underlying layer and as a first conductive film, and an oxide film 105 as a top layer and as a second insulating film.

N-type diffusion layers 106 are formed at a surface of the silicon substrate 101 around the gate electrodes. Each of the gate electrodes is covered at a sidewall thereof with insulating sidewall films 107. A contact hole 110 is formed between the gate electrodes, and thus a top edge portion of the gate electrodes is removed to thereby form a step-like portion. An oxide film 108 as a third insulating film covers the silicon substrate 101 except the step-like portions of the gate electrodes, top edges of the insulating sidewall films 107 and the n-type diffusion layer 106 formed between the gate electrodes.

Figure 12A:
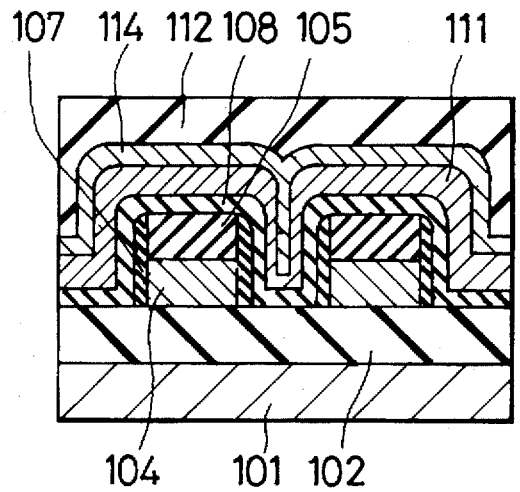
FIGS. 12A, 12B and 13A, 13B are cross-sectional views of a semiconductor device, illustrating respective steps of a method of fabricating a semiconductor device in accordance with the second embodiment of the present invention.
Figure 12B:
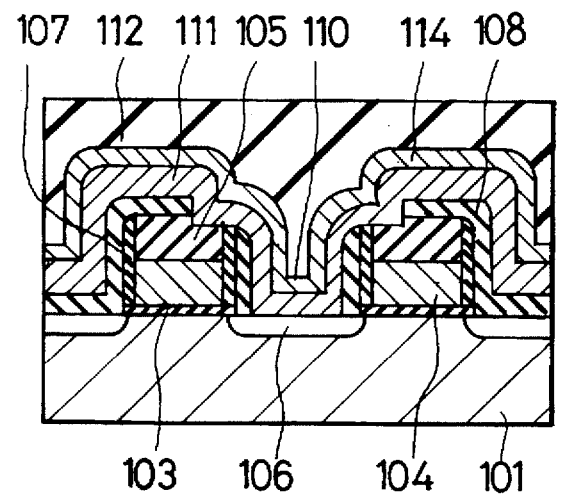

As illustrated in FIGS. 12A and 12B, a tungsten silicide film 111 as a second conductive film covers the oxide film 108, the exposed step-like portions of the gate electrodes, the exposed top edges of the insulating sidewall films 107 and the exposed n-type diffusion layer 106.

The tungsten silicide film 111 as a second conductive film is in turn entirely covered with a polysilicon film 114 as a third conductive film.

Gaps formed between raised portions of the polysilicon film 114 are filled with BPSG film 112 as a fourth insulating film. As best illustrated in FIG. 13B, the BPSG film 112 is planarized at such a level that a top surface of the polysilicon film 114 is in exposure.

The exposed top surface of the polysilicon film 114 and the BPSG film 112 are covered with a tungsten silicide film 113 as a fourth conductive film. That is, the tungsten silicide film 113 bridges over the polysilicon film 114.

In the SRAM cell having the above mentioned structure, the tungsten silicide film 113, the BPSG film 112, the polysilicon film 114 and the tungsten silicide film 111 cooperate with one another to form a ground wiring layer.

Similarly to the first embodiment, in the above mentioned SRAM cell, the second and fourth conductive films 111 and 113 may be composed of refractory metal such as tungsten in place of refractory metal silicide such as tungsten silicide. In addition, though the second and fourth conductive films 111 and 113 are made of common conductive material, for instance, tungsten silicide in the second embodiment, it should be noted that the second and fourth conductive films 111 and 113 may be made of different conductive materials.

The third conductive film 113 may be made of other conductive material than polysilicon. Similarly to the first embodiment, the second insulating film 105 and the insulating sidewall film 107 may be made of nitride in place of oxide.

Hereinbelow is explained a method of fabricating the above mentioned SRAM cell, with reference to FIGS. 12A, 12B, 13A and 13B. The method in accordance with the second embodiment includes the same steps as those of the first embodiment until the second conductive film or tungsten silicide film 11 is formed.

After the formation of the tungsten silicide film 111 having a thickness in the range of 1000 to 2000 angstroms, the polysilicon film 114 having a thickness in the range of 500 to 1500 angstroms is formed over the tungsten silicide film 111, as illustrated in FIGS. 12A and 12B.

Then, the polysilicon film 114 is entirely covered with BPSG film 12, as a fourth insulating film, having a thickness in the range of 5000 to 8000 angstroms. The BPSG film 12 is planarized by high temperature reflow process or other similar process.

Figure 13A:
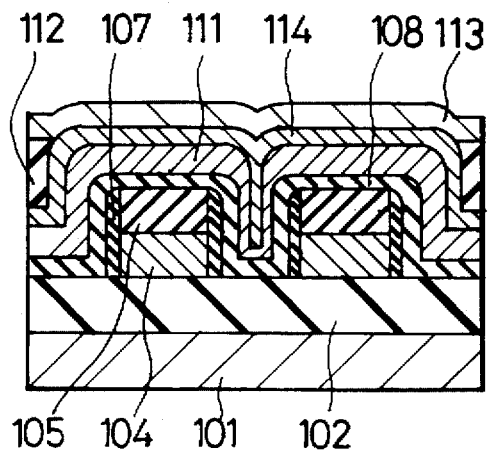
Figure 13B:
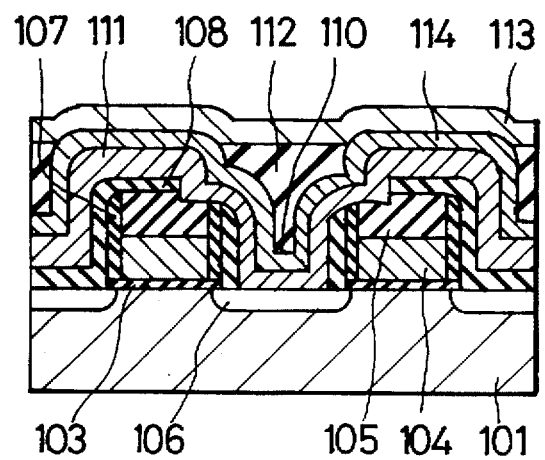

Then, as illustrated in FIGS. 13A and 13B, the BPSG film 12 is wet- or dry-etched until a top surface of the polysilicon film 114 disposed above the gate electrodes appears. Then, the exposed top surface of the polysilicon film 114 and the BPSG film 12 are covered with a tungsten silicide film 113, as a third conductive film, having a thickness in the range of 1000 to 2000 angstroms.

Then, a ground wiring layer constituted of the tungsten silicide films 111 and 113, the polysilicon film 114 and the BPSG film 112 is etched into a desired pattern by using photoresist as follows. First, the tungsten silicide film 113 is etched out by using $SF_6$, followed by the BPSG film 112 being etched by using $CHF_3$. Then, both the polysilicon film 114 and the tungsten silicide film 111 are etched by using $SF_6$.

In the first embodiment, if the BPSG film 12 is overetched, a poor coverage portion of the tungsten silicide film 11, namely a portion having a smaller thickness than other portions and disposed between the gate electrodes (see FIG. 11A) may be eliminated by the over-etching. However, in the second embodiment, the polysilicon film 114 having superior coverage ensures that a poor coverage portion of the tungsten silicide film 111 is not eliminated even if the BPSG film 112 is overetched.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 7-250602 filed on Sep. 28, 1995 including specification, claims, drawings and summary is incorporated herein by reference in its entirety.

What is claimed is:

1. A semiconductor device comprising:
   (a) a semiconductor substrate;
   (b) a first insulating film formed partially on said semiconductor substrate;
   (c) gate electrodes formed on said first insulating film, said gate electrodes having a two-layered structure including a first conductive film and a second insulating film lying over said first conductive film;
   (d) a diffusion layer formed at a surface of said semiconductor substrate around said gate electrodes;
   (e) an insulating sidewall film formed around a sidewall of said gate electrodes;
   (f) a third insulating film partially covering said semiconductor substrate, said insulating sidewall film and said gate electrodes so that said diffusion layer, a part of said gate electrodes and a top edge of said insulating sidewall film are in exposure;
   (g) a second conductive film covering said third insulating film, exposed part of said gate electrodes, exposed top edge of said insulating sidewall film and said semiconductor substrate;
   (h) a fourth insulating film having a planarized top surface at such a level that a top surface of said second conductive film is in exposure; and
   (i) a third conductive film bridging over said top surface of said second conductive film,
   said third conductive film, said fourth insulating film and said second conductive film cooperating with one another to form a ground wiring layer.

2. The semiconductor device as set forth in claim 1, wherein said second conductive film is composed of one of refractory metal and refractory metal silicide.

3. The semiconductor device as set forth in claim 1, wherein said second and third conductive films are made of common conductive material.

4. The semiconductor device as set forth in claim 1, wherein said second and third conductive films are composed of one of refractory metal and refractory metal silicide.

5. The semiconductor device as set forth in claim 1, wherein at least one of said second insulating film and said insulating sidewall film is made of nitride.

6. A semiconductor device comprising:
   (a) a semiconductor substrate;
   (b) a first insulating film formed partially on said semiconductor substrate;
   (c) gate electrodes formed on said first insulating film, said gate electrodes having a two-layered structure including a first conductive film and a second insulating film lying over said first conductive film;
   (d) a diffusion layer formed at a surface of said semiconductor substrate around said gate electrodes;
   (e) an insulating sidewall film formed around a sidewall of said gate electrodes;
   (f) a third insulating film partially covering said semiconductor substrate, said insulating sidewall film and said gate electrodes so that said diffusion layer, a part of said gate electrodes and a top edge of said insulating sidewall film are in exposure;
   (g) a second conductive film covering said third insulating film, exposed part of said gate electrodes, exposed top edge of said insulating sidewall film and said semiconductor substrate;
   (h) a third conductive film covering said second conductive film;
   (i) a fourth insulating film having a planarized top surface at such a level that a top surface of said third conductive film is in exposure; and
   (j) a fourth conductive film bridging over said top surface of said third conductive film,
   said fourth conductive film, said fourth insulating film, said third conductive film and said second conductive film cooperating with one another to form a ground wiring layer.

7. The semiconductor device as set forth in claim 6, wherein said second conductive film is composed of one of refractory metal and refractory metal silicide.

8. The semiconductor device as set forth in claim 7, wherein said third conductive film is composed of polysilicon.

9. The semiconductor device as set forth in claim 6, wherein said second and fourth conductive films are made of common conductive material.

10. The semiconductor device as set forth in claim 9, wherein said second and fourth conductive films are composed of one of refractory metal and refractory metal silicide.

11. The semiconductor device as set forth in claim 10, wherein said third conductive film is composed of polysilicon.

12. The semiconductor device as set forth in claim 6, wherein at least one of said second insulating film and said insulating sidewall film is made of nitride.

* * * * *